United States Patent
Curl et al.

(10) Patent No.: US 7,697,255 B2
(45) Date of Patent: Apr. 13, 2010

(54) DISSIPATOR

(75) Inventors: Ricky L. Curl, Pinson, AL (US);
Frederick Howell Von Herrmann, Birmingham, AL (US)

(73) Assignee: The Von Corporation, Birmingham, AL (US)

( * ) Notice: Subject to any disclaimer, the term of this patent is extended or adjusted under 35 U.S.C. 154(b) by 762 days.

(21) Appl. No.: 11/535,229

(22) Filed: Sep. 26, 2006

(65) Prior Publication Data

US 2007/0081291 A1    Apr. 12, 2007

Related U.S. Application Data

(60) Provisional application No. 60/720,051, filed on Sep. 26, 2005.

(51) Int. Cl.
*H02H 3/20* (2006.01)
*H02H 1/00* (2006.01)

(52) U.S. Cl. .................................................. 361/212
(58) Field of Classification Search .................. 361/212
See application file for complete search history.

(56) References Cited

U.S. PATENT DOCUMENTS

| 4,715,051 | A | * | 12/1987 | Giardina | 377/45 |
| 5,142,342 | A | * | 8/1992 | Stein | 257/461 |
| 5,872,478 | A | * | 2/1999 | Pounds | 327/453 |
| 6,407,603 | B2 | * | 6/2002 | Bendall | 327/175 |
| 6,856,101 | B1 | * | 2/2005 | Hitchcock | 315/227 R |
| 6,953,630 | B2 | * | 10/2005 | Wells | 429/13 |

\* cited by examiner

*Primary Examiner*—Ronald W Leja
(74) *Attorney, Agent, or Firm*—Smith, Gambrell & Russell

(57) ABSTRACT

A dissipator useful for discharging provides a continuously variable high-voltage load under control of a computer or other device capable of providing an analog control voltage. Known dissipator arrangements use multiple high voltage switches and resistors to attempt to dissipate power. However, the disclosed dissipator uses the resistive property of a matrix of photo resistive cells, typically cadmium sulphide arranged on a circuit board. These photo resistive cells are series connected and controlled optically to vary their resistances. An optical control signal is provided for each photo resistive cell by a corresponding light emitting diode (LED). The amount of light emitted by each LED is analog controlled.

8 Claims, 7 Drawing Sheets

Fig_1

Fig_3

Fig_4

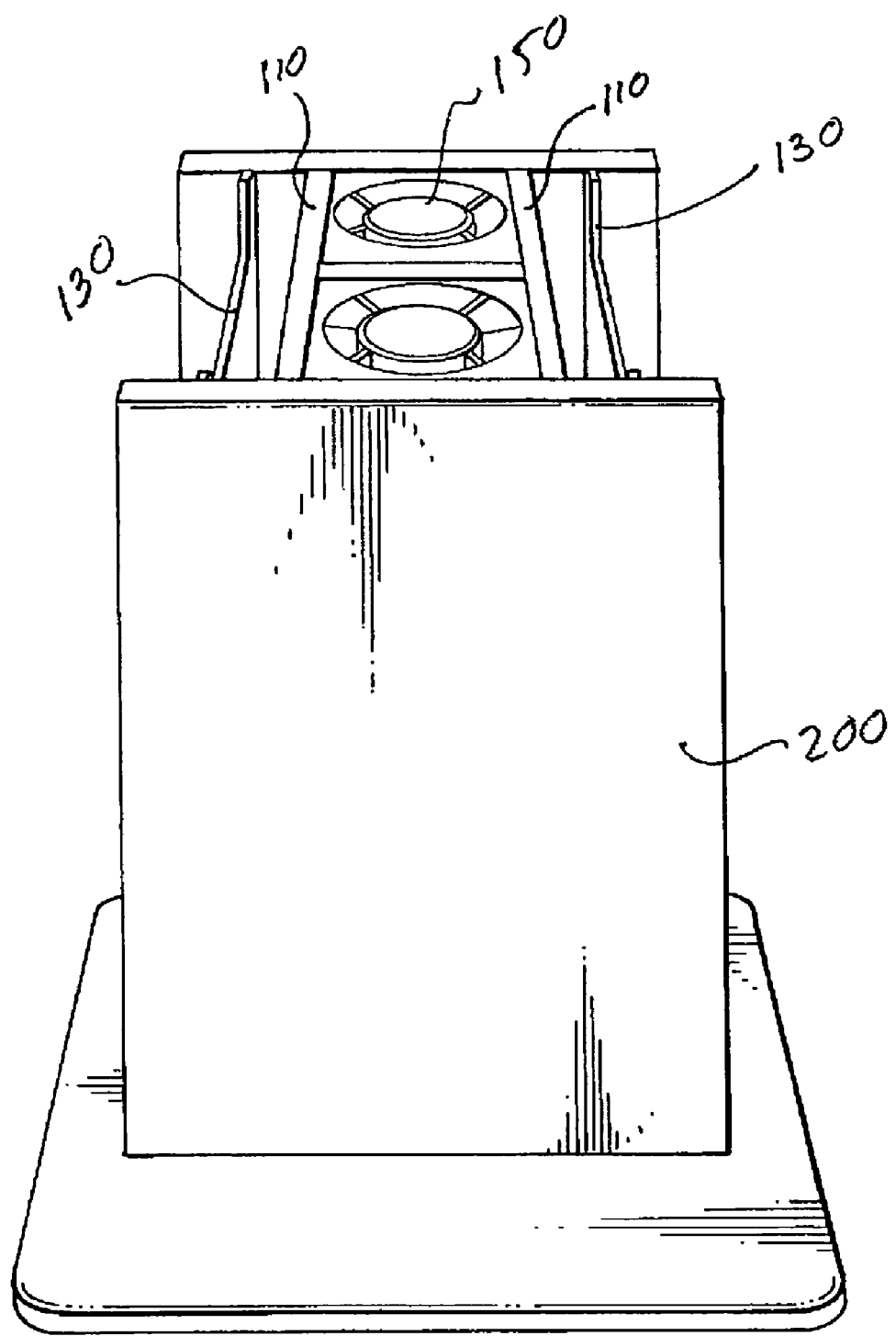
Fig_6

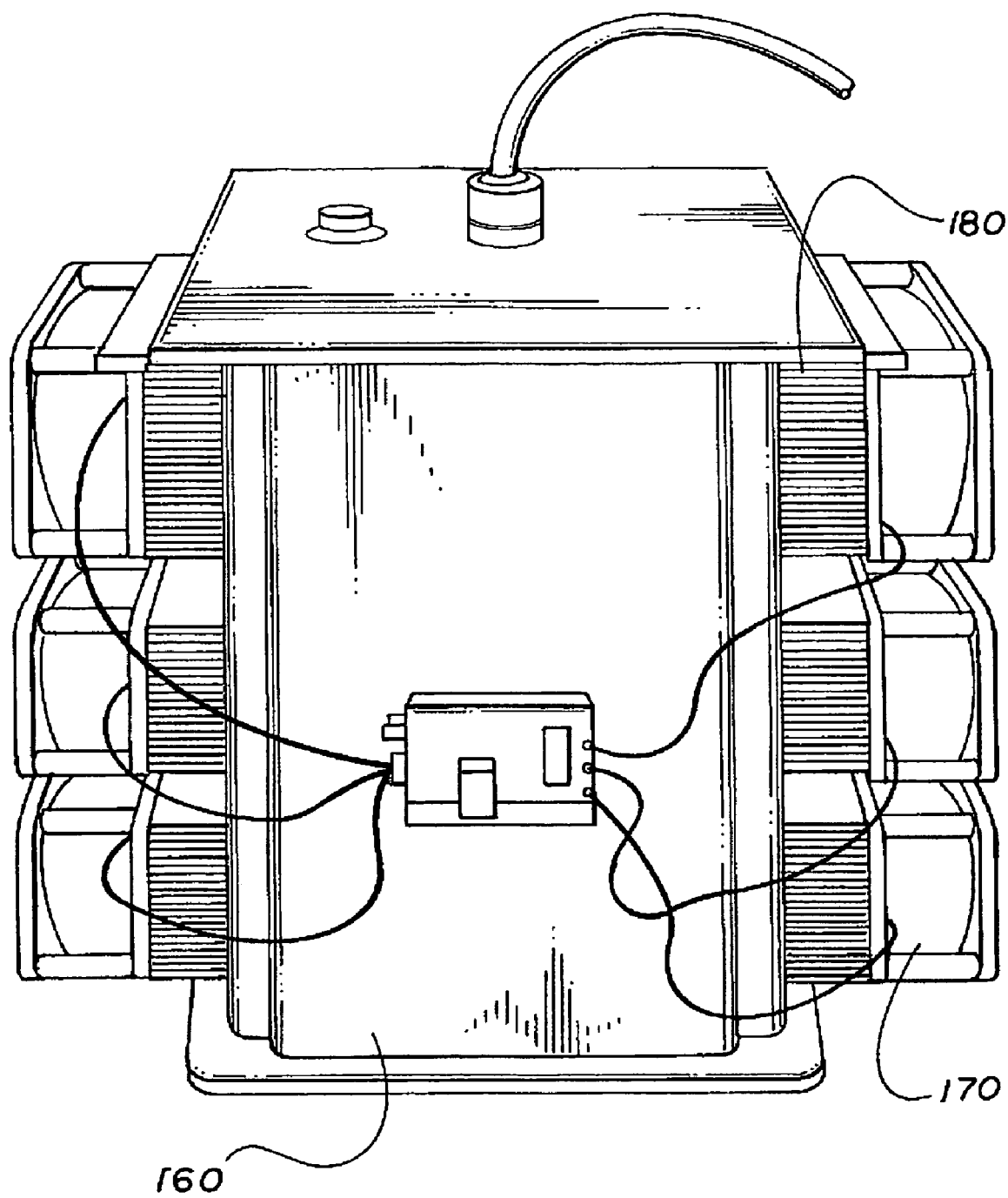
Fig_7

DISSIPATOR

RELATED APPLICATIONS

The instant application is a continuation of and claims priority from Provisional Application Ser. No. 60/720,051 filed Sep. 26, 2005.

BACKGROUND AND SUMMARY

A dissipator provides a continuously variable high-voltage load under control of a computer or other device capable of providing an analog control voltage. It is useful for discharging a capacitor such as a high voltage cable under test at a precisely-controlled rate. It is particularly useful as a component of a very low frequency high voltage test set to test a length of shielded power cable.

Known arrangements for discharging a capacitive load use multiple high voltage switches and resistors to attempt to dissipate power. However, there are operational difficulties associated with such known arrangements. They can only control the load in coarse steps. They do not provide control over a continuous analog range. Mechanical high voltage switches are prone to wear. Load control is inaccurate.

In order to overcome these operational difficulties, this patent document describes a novel arrangement for a dissipator. Rather than use switched resistors to dissipate power, there is provided a matrix of photo resistive cells, typically cadmium sulphide, arranged on a circuit board. These photo resistive cells are series connected and controlled optically to vary their resistances. An optical control signal is provided for each photo resistive cell by a corresponding light emitting diode (LED). The amount of light emitted by each LED is linearly controlled. Analog (linear) control is provided by an operational amplifier circuit that is driven by a control voltage of zero to 4 volts DC. This control voltage can be easily scaled to any value. It may also be digitally controlled. In the presently preferred embodiment, the dissipator can withstand up to 50 Kilovolts and will handle substantially 100 milliamps peak. It is not polarity sensitive and is easily scalable to higher or lower voltages and power levels. The output can be floating in reference to ground.

BRIEF DESCRIPTION OF THE DRAWINGS

FIG. 6 is a view of the complete assembly showing the relationship of respective components.

FIG. 7 is a view of the complete assembly showing external connections.

DETAILED DESCRIPTION

Figure 1:
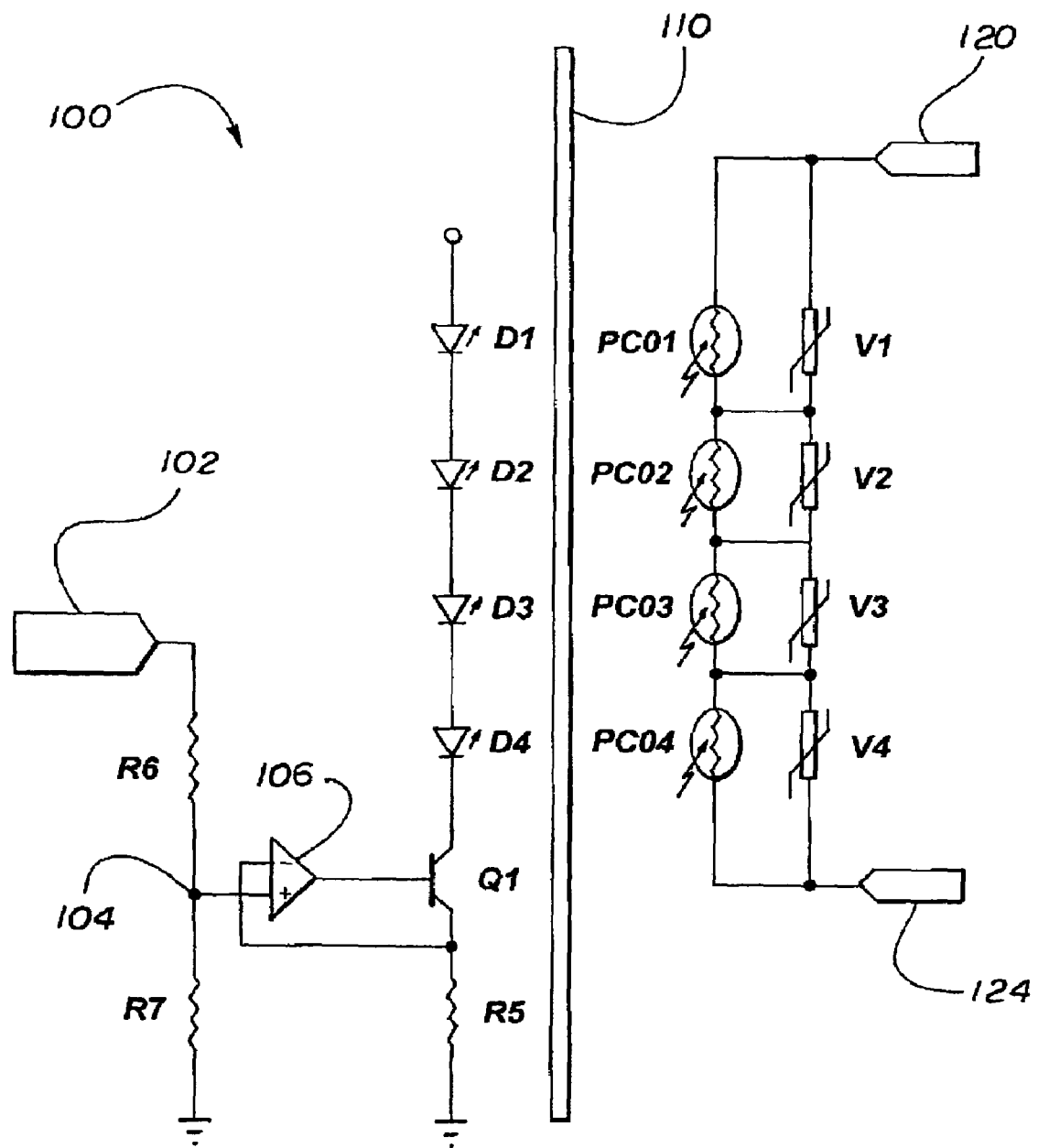
FIG. 1 is a schematic diagram of an embodiment of the dissipator according to the inventions.

FIG. 1 is a schematic diagram of an embodiment of the dissipator according to the inventions.

The dissipator, according to the inventions, is generally denoted by reference numeral 100. A control voltage is applied at a control terminal 102. Typically, the control voltage is zero to 4 volts DC. However, the control voltage can be scaled to any value required by a system in which the dissipator is used. Also a digital control signal can be applied, such as, for example, from a computer based control system.

The control signal is applied to a resistive divider including resistors R6 and R7. In the presently preferred embodiment R6 has a value of 10 KΩ and R7 has a value of 100 KΩ. A node 104 of the resistive divider is coupled to the [+] input of an operational amplifier 106, preferably an MCP6021 or equivalent. Of course other types of operational amplifiers can be used with appropriate design adjustments, as necessary.

A series of 4 Light Emitting Diodes (LED) D1 . . . D4 is coupled from a first voltage source V1 to the collector of a drive transistor Q1, preferably a 2N4124. The emitter of transistor Q1 is coupled through a resistor R5 to ground. In the presently preferred embodiment R5 has a value of 120 Ω. The [−] input of operational amplifier 106 is coupled to the emitter of transistor Q1 and to resistor R5. The components described thus far including control input, resistive divider, LEDs, operational amplifier and driving transistor together constitute a "low voltage side" of the dissipator.

For convenience, only 4 LEDs D1 . . . D4 are shown in the drawing. Actually, the number of LEDs in series is a matter of design choice and can be varied as needed. In the presently preferred embodiment, there are 128 green LED's arranged in 32 series strings of 4. Power to each string of 4 LEDs is provided by a constant current driver. The current to all LED's in the array is modulated by a zero to four volt control voltage. In the voltage modulation range, the amount of light output by an LED is a function of the control voltage. By varying the control voltage, the amount of light output can be linearly controlled. At the time of this writing, it is preferred to use green LED's because the emitted wavelength most closely matches the spectral response of the photo resistive cells used on the "high voltage side" of the dissipator.

The low and high voltage sides of the dissipator are isolated in part by a piece of ⅛" thick clear acrylic plastic barrier 110. Further isolation is provided by oil 190 (see FIG. 5) into which all components are immersed. The oil 190 also provides a mechanism for heat dissipation.

On the high voltage side of the dissipator, there are multiple photo resistive cells, typically cadmium sulphide. In the drawing, only four photo resistive cells PC01, PC02, PC03 and PC04 are shown for convenience. In the presently preferred embodiment there are 128 photo resistive cells arranged electrically in series on a circuit board 126 (see FIG. 2). These photo resistive cells are used as variable resistors. The amount of resistance presented by a photo resistive cell is a function of the amount of light received by it. By controlling the amount of light output by the various LEDs, the amount of resistance of the photo resistive cells is controlled. Photo resistive cells PC01 . . . PC04, along with the other components are immersed in oil and are controllably illuminated by the green LED's controlled by a variable constant-current driver. Photo resistive cells PC01 . . . PC04 are preferably 0.4" diameter cadmium sulphide photo resistive cells, selected for their high power and high voltage capabilities.

Varistors V1 . . . V128 are 390 volt surface-mount varistors soldered in place directly behind photo resistive cells PC01 . . . PC128, respectively. Each varistor is electrically connected in parallel with its respective photo resistive cell. The varistors ensure that the voltage divides equally across each cell and protects the entire unit from overvoltage. Typically the photo resistive cells are rated for operation at 300 V. In the preferred embodiment, these cells are operated at 400 V. It is possible to operate the cells beyond their normal rated voltage due to the electrical insulating and heat dissipating properties of the oil. The varistors help to evenly divide the voltage and prevent burnout of individual photo resistive cells.

In the presently preferred exemplary embodiment, the output can withstand up to 50 Kilovolts and will handle about 100 milliamps peak. It is not polarity sensitive and is easily scalable to higher or lower voltages and power levels. The output can be floating in reference to ground.

Voltage to be dissipated is connected between terminals 120 and 124. Typically the high voltage side of the voltage to be dissipated is connected to terminal 120 and the low voltage side of the voltage to be dissipated is connected to terminal 124.

Figure 2:
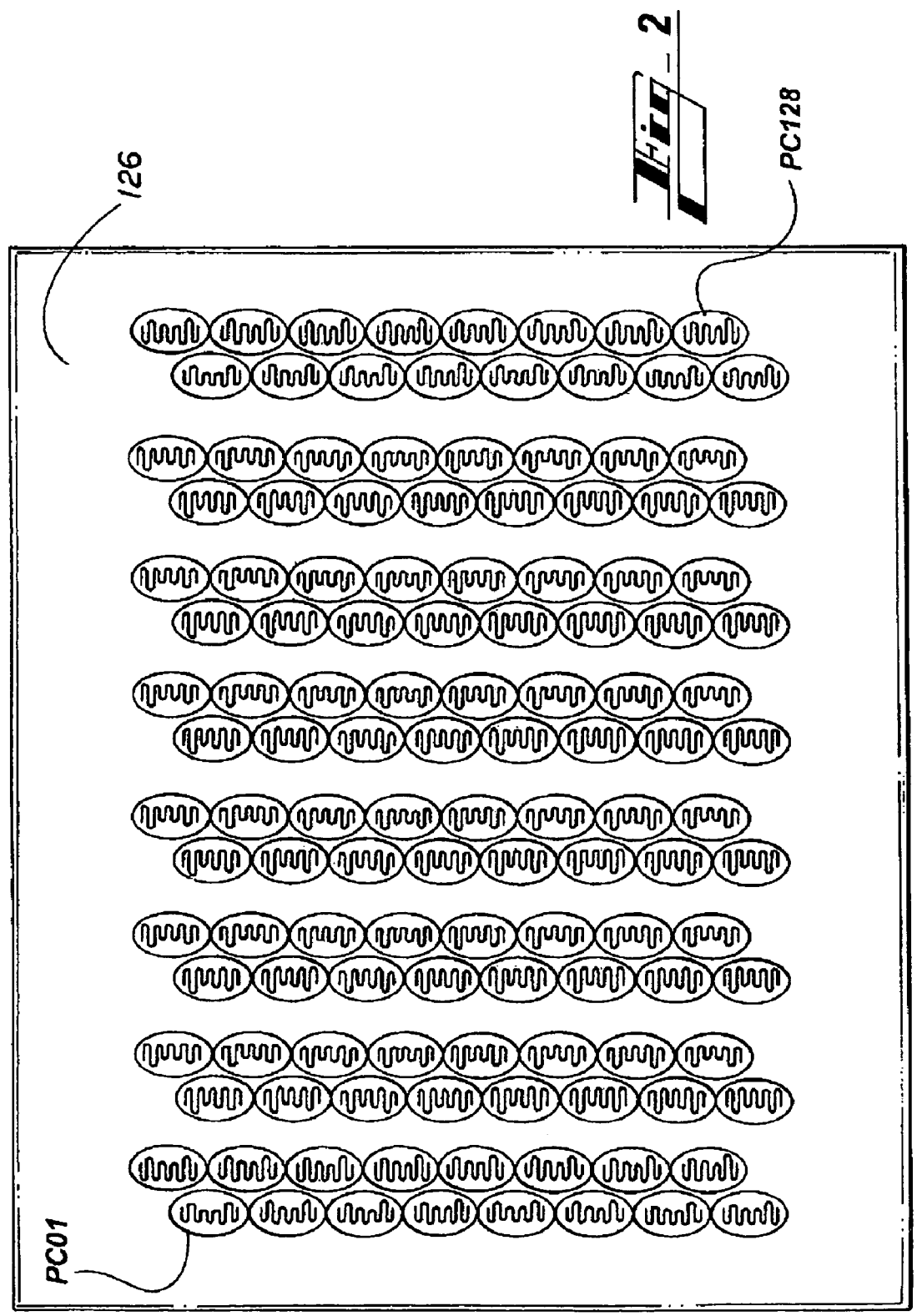
FIG. 2 is a diagram of a circuit board containing 128 cadmium sulphide photocells.

FIG. 2 is a diagram of a circuit board 126 containing photo resistive cells PC01 . . . PC128. Varistors V1 . . . V128 are mounted respectively behind corresponding photo resistive cells.

Figure 3:
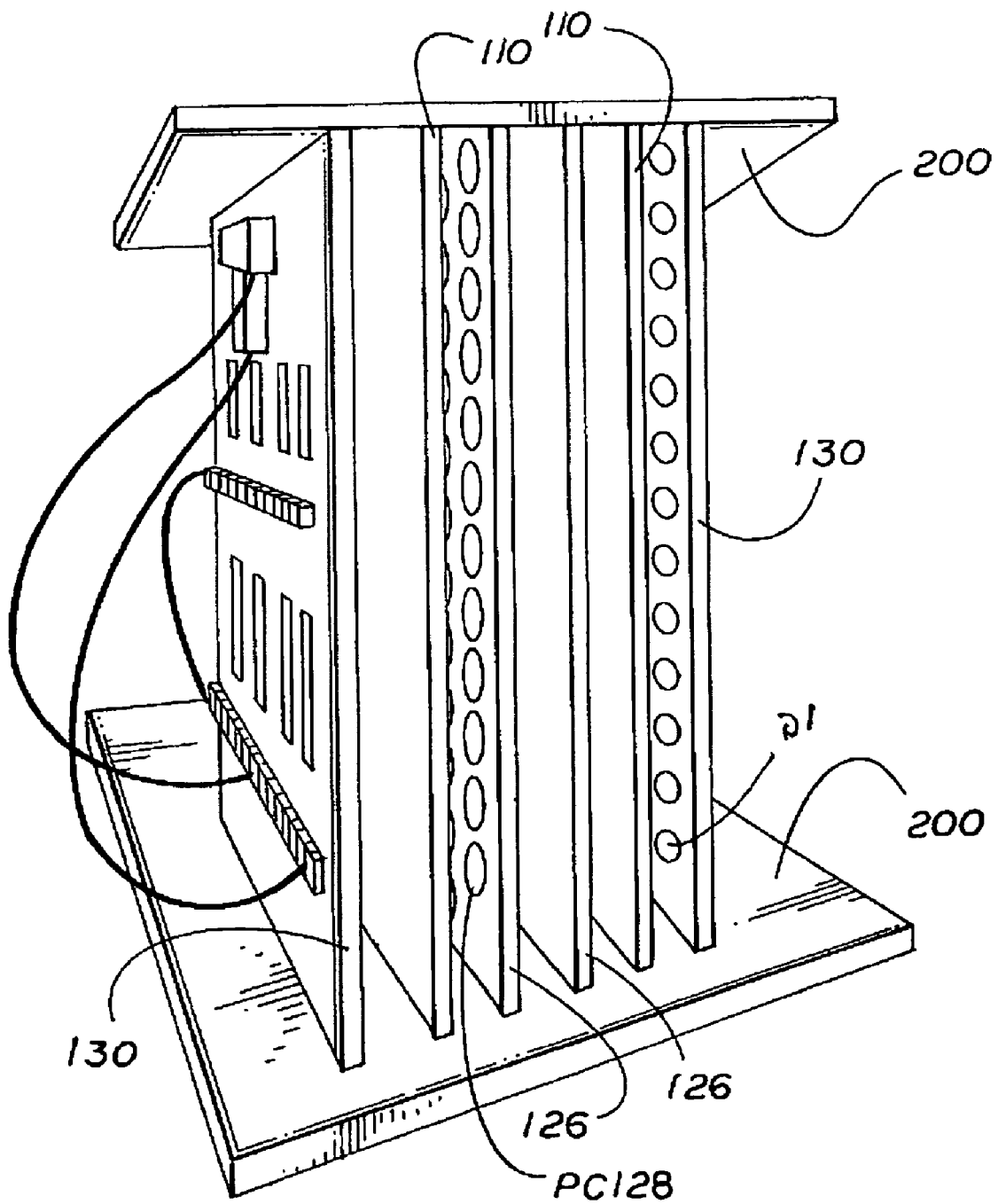
FIG. 3 is a drawing of a presently preferred embodiment of a complete dissipator assembly.

FIG. 3 is a drawing of a presently preferred embodiment of a complete dissipator assembly. In this embodiment there are two identical assemblies back to back. Each assembly includes a circuit board 130 containing the LEDs, a circuit board 126 containing the photo resistive cells and a clear acrylic plastic barrier 110. Additional structural components 200 allow the entire assembly to be conveniently immersed in a tank of oil which dissipates heat generated by the various elements. The oil can be circulated to dissipate even more heat.

Figure 4:
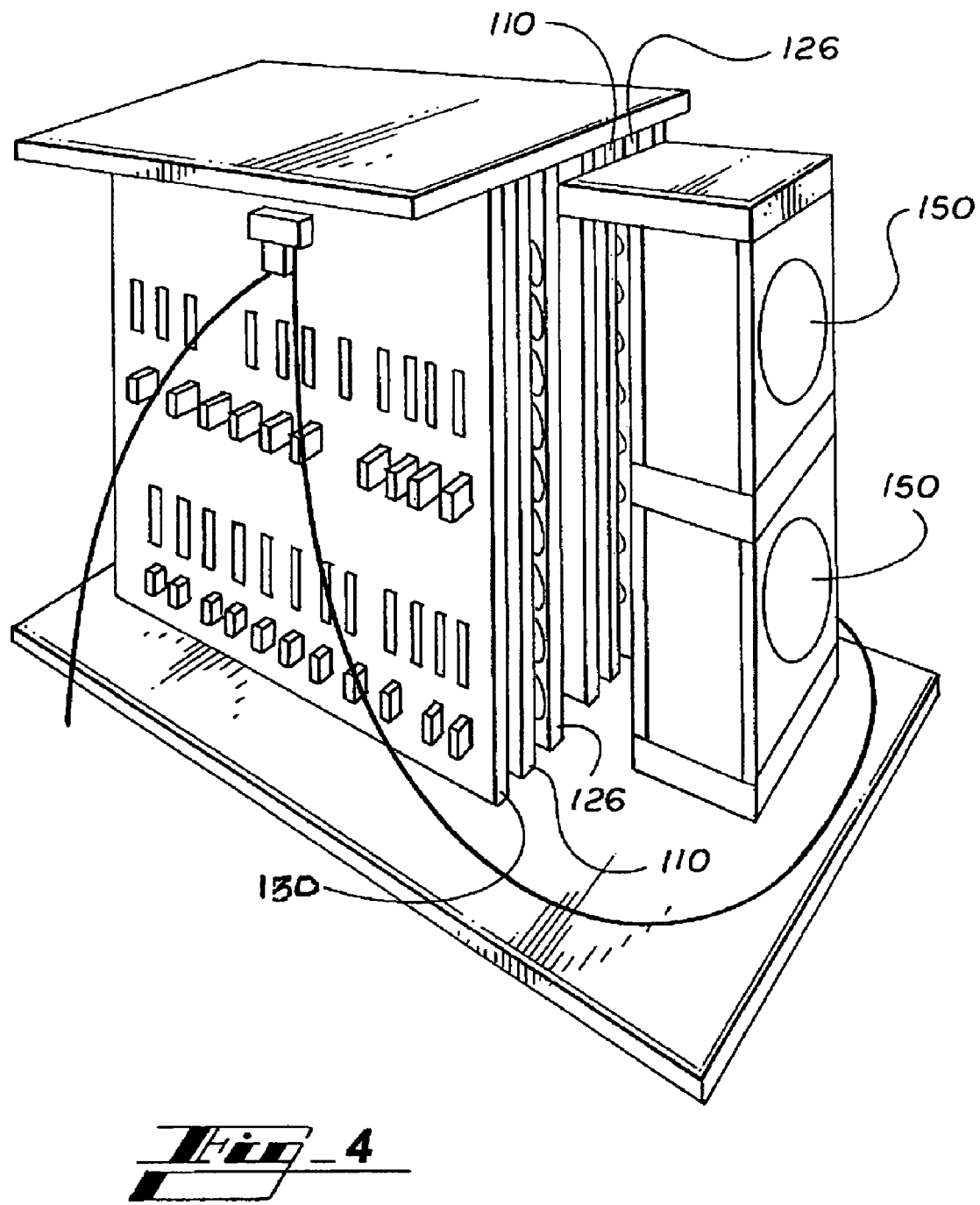
FIG. 4 is a view of the dissipator assembly showing components on circuit board 130.

FIG. 4 is a view of the dissipator assembly showing components on circuit board 130. In this view, the components shown have not yet been installed into tank 160 and immersed in oil 190. Fans 150 circulate oil 190 after this assembly has been placed into tank 160 which is then filled with oil.

Figure 5:
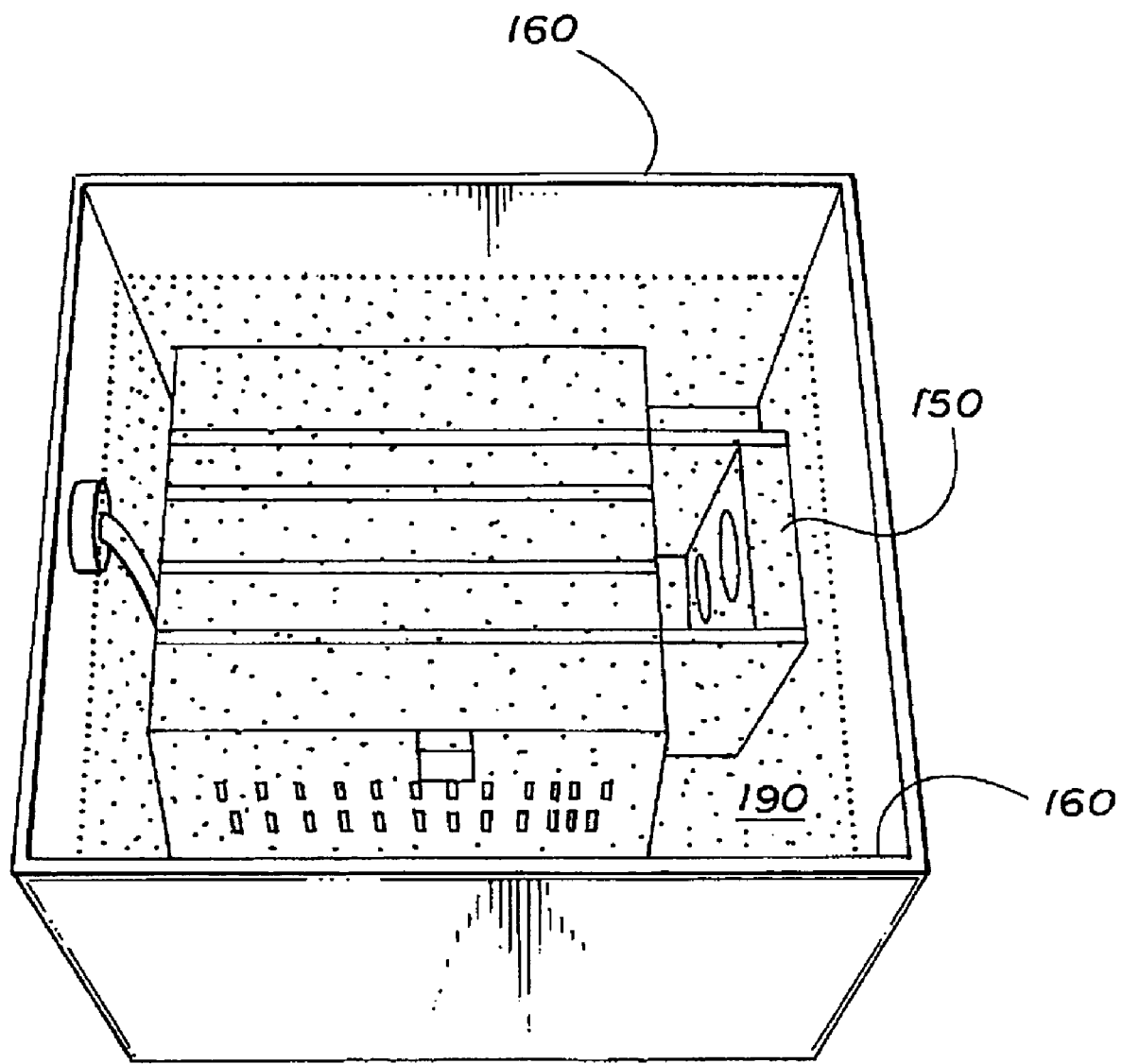
FIG. 5 is a view of the complete assembly showing how it is immersed in oil.

FIG. 5 is a view of the complete assembly showing how it is immersed in oil. The photo resistive cells and varistors are immersed in insulating oil 190 (see FIG. 5) to carry away heat and to increase the high voltage properties of the cells. The oil is circulated using two 40 mm DC fans 150 immersed in the oil. The oil is enclosed in an aluminum tank 160.

FIG. 6 is a view of the complete assembly showing the relationship of respective components before being placed inside tank 160. The assembly shown includes two sets of LEDs Dn, barrier 110 and photo cells PCn (back to back).

FIG. 7 is a view of the complete assembly showing external connections. The dissipator provides a continuously variable high-voltage load under control of a computer or other device capable of providing an analog control voltage. The outside of tank 160 is fitted with six 90 mm fans 170 on finned heat sinks 180 to dissipate heat to the outside.

Alternative embodiments within the spirit of this disclosure are intended to be covered by the claims. For example it possible to utilize more or less LEDs and photo cells. Specific component values are a function of the characteristics of the energy to be dissipated.

The invention claimed is:

1. A dissipator for dissipating energy stored in a reactive circuit, comprising: a series circuit of light emitting diodes (LED's); a control circuit for varying the luminous intensity of the LED's in accordance with a low-voltage analog control signal; a series circuit of high voltage photo resistive elements arranged so that each photo resistive element receives a control light signal from a corresponding light emitting diode, whereby the resistance of each photo resistive element is varied in accordance with said luminous intensity; an optically transmissive medium interposed between said series circuit of light emitting diodes and said series circuit of photo resistive elements; and at least one connector for electrically connecting the circuit to be dissipated to the series circuit of photo resistive elements.

2. A dissipator according to claim 1 wherein the reactive circuit is a capacitive circuit.

3. A dissipator according to claim 1 further comprising a varistor corresponding to each photo resistive element and wired in parallel therewith to protect said photo resistive element from overload conditions.

4. A dissipator according to claim 1 wherein the control circuit comprises: an input for receiving an analog control signal; a resistive divider for dividing the analog control signal; an operational amplifier for receiving the analog control signal and providing an output; and a semiconductor device, controlled by the output of the differential amplifier, for controlling current flowing through the light emitting diodes.

5. A dissipator according to claim 1 further comprising: a case; and said optically transmissive medium comprising oil contained within the case, the light emitting diodes and photo resistive elements being immersed within the oil.

6. A dissipator according to claim 5 further comprising a fan for circulating the oil about the photo resistive elements.

7. A dissipator according to claim 5 wherein said optically transmissive medium comprises an acrylic barrier interposed between said series circuit of light emitting diodes and said series circuit of photo resistive elements.

8. Apparatus for dissipating stored energy in a capacitive circuit at a precisely controlled rate comprising:
    a. a low voltage control circuit comprising an operational amplifier circuit for receiving a variable analog control signal and providing an analog output,
    b. a circuit of light emitting diodes operatively connected to said operational amplifer output whereby the luminescence of said circuit of light emitting diodes is variable;
    c. a high voltage circuit comprising one or more of photo resistive elements operatively connected to said capacitive circuit and in optical communication with said circuit of light emitting diodes such that the resistance of said high voltage circuit varies in accordance with the luminescence of said circuit of light emitting diodes; and,
    d. an optically transmissive medium interposed between said circuit of light emitting diodes and said circuit of photo resistive elements.

* * * * *